(12) United States Patent
Itoh

(10) Patent No.: US 8,502,171 B2
(45) Date of Patent: Aug. 6, 2013

(54) MASK MANUFACTURING DEVICE

(75) Inventor: Masamitsu Itoh, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/326,612

(22) Filed: Dec. 15, 2011

(65) Prior Publication Data

US 2012/0091370 A1 Apr. 19, 2012

Related U.S. Application Data

(62) Division of application No. 12/350,394, filed on Jan. 8, 2009, now Pat. No. 8,097,539.

(30) Foreign Application Priority Data

Jan. 10, 2008 (JP) .................................. 2008-003504

(51) Int. Cl.
*A61N 5/00* (2006.01)
(52) U.S. Cl.
USPC ............ 250/492.1; 250/492.3; 430/5; 430/30
(58) Field of Classification Search
CPC .......... G21K 5/00; G21K 5/10; H01L 21/3086; H01L 21/3088
USPC .................. 438/700, 735; 250/492.1, 492.2, 250/492.21, 492.22, 492.23, 492.24, 492.3; 216/40.1, 44, 409; 430/4, 5, 30; 425/171
See application file for complete search history.

(56) References Cited

U.S. PATENT DOCUMENTS

| | | | |
|---|---|---|---|
| 7,295,288 B1 * | 11/2007 | Subramanian et al. | ......... 355/75 |
| 2003/0157415 A1 | 8/2003 | Ziger | |
| 2003/0207184 A1 * | 11/2003 | Smith | ............................... 430/5 |
| 2005/0136341 A1 | 6/2005 | Park et al. | |
| 2005/0236739 A1 | 10/2005 | Willson et al. | |
| 2008/0026300 A1 | 1/2008 | Itoh | |
| 2008/0032206 A1 | 2/2008 | Lee et al. | |
| 2008/0311486 A1 | 12/2008 | Itoh | |

OTHER PUBLICATIONS

White et al.; "Novel Alignment System for Imprint Lithography"; The Journal of Vacuum Society Technology B, vol. 18, No. 6, pp. 3552-3556, (2000).

* cited by examiner

*Primary Examiner* — Khiem D Nguyen
(74) *Attorney, Agent, or Firm* — Finnegan, Henderson, Farabow, Garrett & Dunner, L.L.P.

(57) ABSTRACT

A pattern is formed on a mask substrate. Positional deviation information between an actual position of the pattern formed on the mask substrate and a design position decided at the time of designing the pattern is calculated. A heterogeneous layer of which a volume expands more greatly than that of surrounding mask substrate region is formed in a predetermined position within the mask substrate so that volume expansion of the heterogeneous layer according to the positional deviation information is achieved.

5 Claims, 7 Drawing Sheets

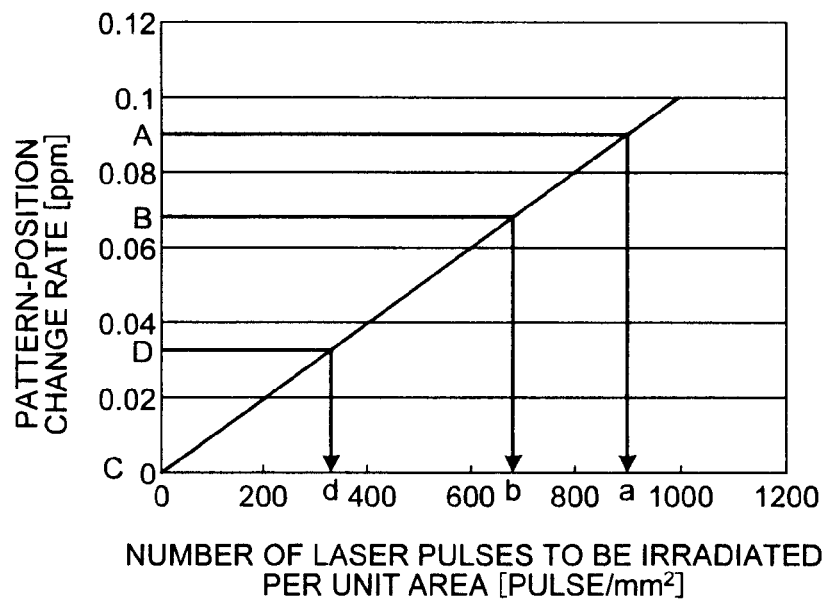
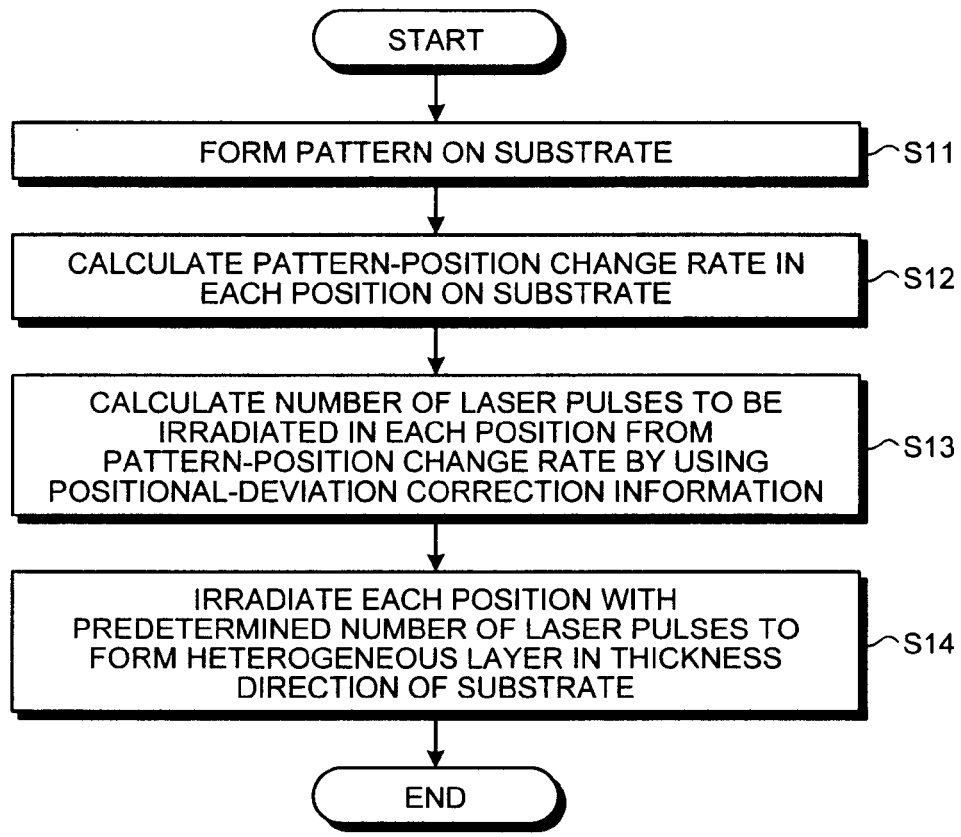

PATTERN-
POSITION
CHANGE RATE a    b    0    d

MASK MANUFACTURING DEVICE

This is a division of Application No. 12/350,394, filed Jan. 8, 2009, issued as U.S. Pat. No. 8,097,539, which is incorporated herein by reference.

CROSS-REFERENCE TO RELATED APPLICATIONS

This application is based upon and claims the benefit of priority from the prior Japanese Patent Application No. 2008-3504, filed on Jan. 10, 2008; the entire contents of which are incorporated herein by reference.

BACKGROUND OF THE INVENTION

1. Field of the Invention

The present invention relates to an imprint mask manufacturing method for nanoimprinting, an imprint mask manufacturing device for nanoimprinting, and a semiconductor device manufacturing method using the imprint mask.

2. Description of the Related Art

Recently, along with advancement of downsizing of semiconductor devices, a problem in a photolithography step in the semiconductor device manufacturing process has become remarkable. Concretely, in a design rule of the latest semiconductor device at this point, downsizing has so advanced that the half pitch (hp) is about 22 nanometers, and when the conventional lithography by a reduced pattern transcription using light is used, resolution of this order cannot be achieved, resulting in a situation where the pattern formation has become difficult. As a result, in recent years, instead of the lithography, nanoimprint technique has been employed.

The nanoimprinting is a technique for forming a pattern on a substrate. Concretely, the nanoimprinting includes pressing an imprint mask having a pattern shape formed thereon against an imprint material (a coating material) coated on the substrate, waiting until the imprint material solidifies thereby forming a model of the pattern shape on the imprint mask. The nanoimprinting is free of variable factors such as a focal depth, aberration, and an exposure amount that caused problem in the conventional lithography that employed light. Moreover, if only a highly accurate imprint mask is formed, it is possible to very easily and accurately transcript the pattern of the imprint mask.

Meanwhile, when manufacturing semiconductor devices, a new pattern is sometimes formed on a substrate having an old pattern previously formed thereon. When the nanoimprint technique is used to form such a new pattern, high alignment accuracy is required between the imprint mask and the substrate. A pattern on the imprint mask generally has positional distortion, so that when forming a new pattern that matches with an underlying old pattern, it is preferable to first solve the issue of pattern positional distortion of the imprint mask. With respect to a first-order component deviation such as a magnification, for example, out of the pattern positional distortion, the deviation can be taken care of by pressing an end surface of the imprint mask. Such a technique has been disclosed, for example, in D. L. White and O. R. Wood II, "Novel alignment system for imprint lithography", The Journal of Vacuum Society Technology B 18(6), November/December 2000, American Vacuum Society. However, when the imprint mask has a pattern positional deviation of a second or higher order complicated shape, or when the magnification needs to be enlarged, for example, there is a problem that with the method described in the above-mentioned literature, it is not possible to solve the pattern positional distortion of the imprint mask.

SUMMARY OF THE INVENTION

According to an aspect of the present invention, there is provided an imprint mask manufacturing method including forming a pattern on a mask substrate; calculating positional deviation information between an actual position of the pattern formed on the mask substrate and a design position decided at the time of designing the pattern; and forming a heterogeneous layer of which a volume expands more greatly than that of surrounding mask substrate region in a predetermined position within the mask substrate so that volume expansion of the heterogeneous layer according to the positional deviation information is achieved.

According to another aspect of the present invention, there is provided a semiconductor device manufacturing method including coating an entire surface on a processing target film formed on a semiconductor substrate with a coating material; positioning the imprint mask manufactured by the method according to claim 1 with respect to the semiconductor substrate to be pressed on the processing target film via the coating material; solidifying the coating material; and separating the imprint mask from the processing target film to process the processing target film by using a coating material pattern left on the processing target film as a mask.

According to still another aspect of the present invention, there is provided an imprint mask manufacturing device including a positional-deviation calculating unit that calculates positional deviation information between an actual position of a pattern formed on a mask substrate and a design position decided at the time of designing the pattern for each position on the mask substrate; an irradiating-condition calculating unit that uses positional-deviation correction information, which indicates a relationship between an irradiating amount and an irradiating position of radiation to the mask substrate and a pattern position change after irradiation of the radiation, to calculate an irradiating condition including the irradiating amount and the irradiating position of the radiation to correct the positional deviation calculated for each position on the mask substrate; and an irradiating unit that irradiates the mask substrate with the radiation under the irradiating condition calculated by the irradiating-condition calculating unit.

BRIEF DESCRIPTION OF THE DRAWINGS

FIG. 3 is a graph of one example of positional-deviation correction information;

FIG. 4 is a flowchart of one example of a procedure of an imprint mask manufacturing method executed by the imprint mask manufacturing device shown in FIG. 1;

DETAILED DESCRIPTION OF THE EMBODIMENTS

The embodiments of an imprint mask manufacturing method, an imprint mask manufacturing device, and a semiconductor device manufacturing method according to the present invention will be explained below in detail with reference to the accompanying drawings. The present invention is not limited to the following embodiments. Cross-sectional views of an imprint mask in the following embodiment are only schematic, and do not represent the actual ratio.

Figure 1:
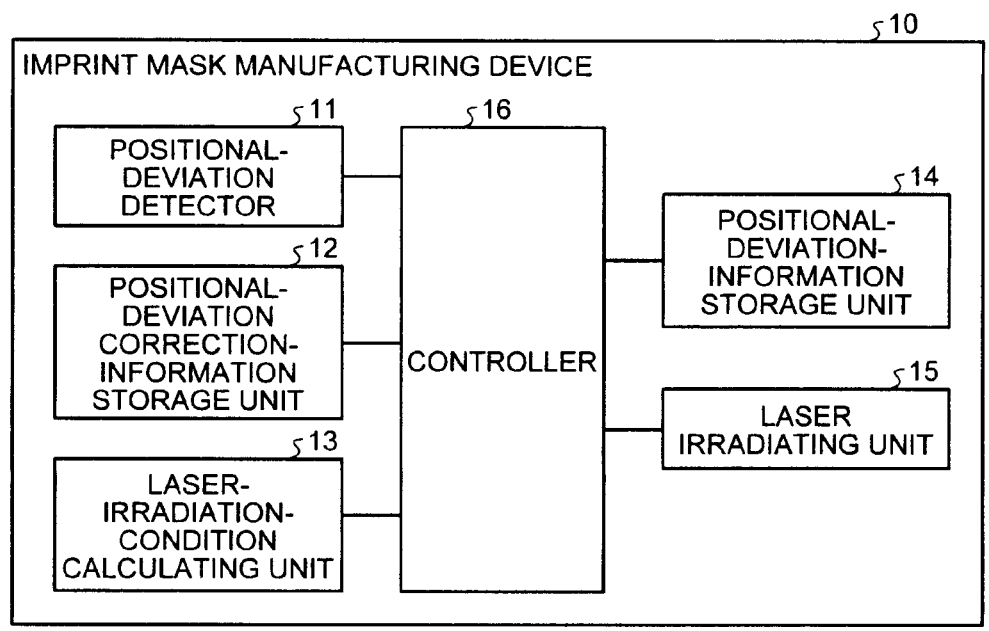
FIG. 1 is a schematic block diagram of one example of a functional configuration of an imprint mask manufacturing device according to an embodiment of the present invention.

FIG. 1 is a schematic block diagram of one example of a functional configuration of an imprint mask manufacturing device 10 according to an embodiment of the present invention. The imprint mask manufacturing device 10 includes a positional-deviation detector 11, a positional-deviation correction-information storage unit 12, a laser-irradiation-condition calculating unit 13, a positional-deviation-information storage unit 14, a laser irradiating unit 15, and a controller 16 that controls each of the processing units.

The positional-deviation detector 11 detects a positional deviation of a predetermined position on the mask substrate from an ideal position of a reference pattern actually formed on a mask substrate, and then calculates a pattern-position change rate indicating a ratio of the positional deviation to a distance between adjacent ideal reference patterns. In the present embodiment, the predetermined position on the mask substrate is assumed to be a positional-deviation corrected region surrounded by reference patterns formed on the mask substrate. The pattern-position change rate calculated by the positional-deviation detector 11 is associated with the positional-deviation corrected region, and stored in the positional-deviation-information storage unit 14. The reference pattern is prepared for detecting a positional deviation (positional distortion) of the pattern for manufacturing a semiconductor device formed on the mask substrate, and on the design, determined to be formed at a predetermined interval. The positional deviation can be detected with a laser interferometer or the like.

Figure 2A:
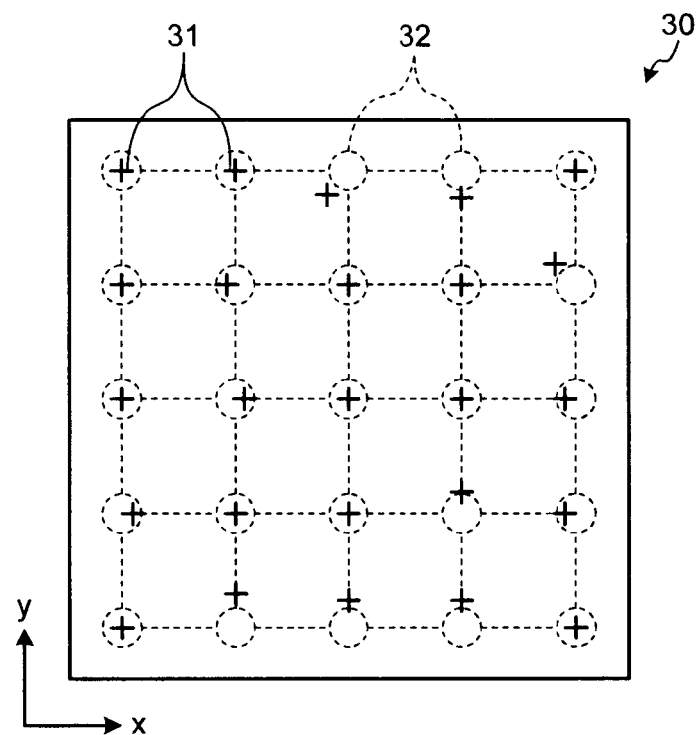
FIGS. 2A and 2B are schematic diagrams of a reference pattern formed on an imprint mask substrate.
Figure 2B:
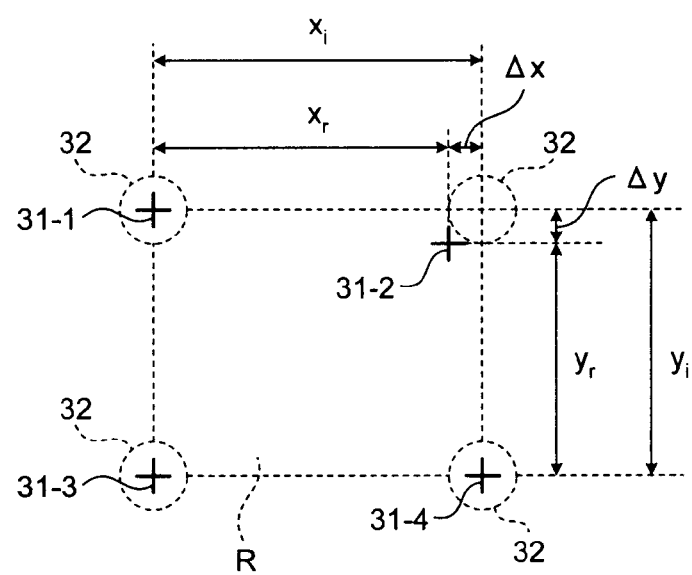

FIG. 2A and FIG. 2B are schematic diagrams of a reference pattern formed on an imprint mask substrate. Particularly, FIG. 2A is a schematic plan view of one example of a relationship between actual positions of reference patterns formed on an imprint mask substrate and ideal positions, and FIG. 2B is for explaining one example of a method of calculation of a positional deviation amount of the reference pattern. In FIGS. 2A and 2B, cross patterns 31, drawn with a solid line, indicate the actual positions at which the reference patterns are formed on a mask substrate 30 (hereinafter, also "substrate 30") and circular patterns 32, drawn with a dotted line, indicate the ideal positions on the mask substrate 30 at which the reference patterns are placed. Each ideal position of the reference pattern is a designed reference-pattern position, for example. Two directions orthogonal to each other on the mask substrate 30 are an x-axis direction and a y-axis direction.

As indicated by each circular pattern 32 in FIG. 2A, it is desired that the reference patterns are formed in a lattice at a predetermined interval (for example, 5-mm interval) in both the x-axis direction and the y-axis direction on the mask substrate 30. However, in practice, as indicated by each cross pattern 31, the actual positions of the reference patterns are can deviate from the ideal positions (the circular patterns 32). In this case, with respect to the smallest rectangular region (the positional-deviation corrected region) configured by the four reference patterns out of a plurality of reference patterns formed on the mask substrate 30, the positional-deviation detector 11 detects a positional deviation amount from the ideal position (the circular pattern 32) by using the actual positions (the cross patterns 31) of the reference patterns adjacent with respect to each of the x-axis direction and the y-axis direction. The positional-deviation detector 11 calculates the pattern-position change rate, which is a ratio of the positional deviation amount of each of the x-axis direction and the y-axis direction with respect to a distance between the ideal reference patterns (the circular patterns 32). The pattern-position change rates are calculated for all the positional-deviation corrected regions.

A case of evaluating the pattern-position change rate in a positional-deviation corrected region R surrounded by cross patterns 31-1 to 31-4 by four solid lines shown in FIG. 2B has been described as an example. A pattern-position change rate of the positional-deviation corrected region R in the x-axis direction is to be calculated by using a detection result on the top side of the positional-deviation corrected region R, and a pattern-position change rate in the y-axis direction is to be calculated by using a detection result of the right side of the positional-deviation corrected region R.

A positional deviation amount $\Delta x$ of the positional-deviation corrected region R in the x-axis direction is calculated, based on the precondition, as a difference between a distance $x_r$ in the x-axis direction between the cross patterns 31-1 and 31-2 configuring the top side of the positional-deviation corrected region R, and a distance $x_i$ in the x-axis direction between the circular patterns 32 or adjacent reference patterns formed at the ideal positions. A positional deviation amount $\Delta y$ of the positional-deviation corrected region R in the y-axis direction is similarly calculated as a difference between a distance $y_r$ in the y-axis direction between the cross patterns 31-2 and 31-4 configuring the right side of the positional-deviation corrected region R, and a distance $y_i$ in the y-axis direction between the adjacent circular patterns 32 formed at the corresponding ideal positions.

The pattern-position change rate in the x-axis direction is then evaluated according to $\Delta x/x_i$, where $\Delta x$ denotes a positional deviation amount in the x-axis direction for the distance $x_i$ between the reference patterns (the circular patterns 32) at the ideal positions. The pattern-position change rate in the y-axis direction is similarly evaluated according to $\Delta y/y_i$, where $\Delta y$ denotes a positional deviation amount in the y-axis direction for the distance $y_i$ between the reference patterns (the circular patterns 32) at the ideal positions. The positional deviation amounts $\Delta x$ and $\Delta y$ are expressed by an absolute value of a deviation from the ideal position. The pattern-position change rates are evaluated as a macro positional deviation amount in the order of millimeter, obtained by accumulating positional deviations in nanometer order.

In the above example, for the detection of the pattern positional deviation on the mask substrate, a case that the reference patterns formed on the mask substrate are used is described. However, instead of forming the reference patterns on the mask substrate, it is possible to detect a positional deviation of a mask pattern, formed on the mask substrate, for forming a device pattern of a normal semiconductor device. That is, a positional deviation from an ideal position of the device pattern forming pattern formed on the mask substrate can be detected.

The positional-deviation correction-information storage unit 12 stores therein positional-deviation correction information indicating a relationship between a laser irradiating amount and a laser irradiating position for the mask substrate, and a pattern-position change amount (rate) after the laser irradiation. The positional-deviation correction information differs depending on a difference in wavelength of a laser beam to be irradiated, the output thereof, the beam radius thereof, the beam length thereof, a mask-substrate material or the like, and thus it is previously evaluated by an experiment. In the present embodiment, as the laser irradiating amount, the number of laser pulses to be irradiated is used.

FIG. 3 is a graph of one example of positional-deviation correction information indicating a relationship between a laser irradiating amount and a pattern position change amount (rate) when the irradiating position is near the center of the thickness of the mask substrate. In FIG. 3, the horizontal axis indicates the number of laser pulses to be irradiated (hereinafter, "laser-pulse irradiating density") per unit area, and the vertical axis indicates a pattern-position change rate in an expanding direction. The positional-deviation correction information is evaluated as a ratio of a positional change on a side of a square when a predetermined area (for example, an area of 10 square millimeters) of a square near the center in the thickness direction of a mask substrate is irradiated with a predetermined number of laser pulses. As shown in FIG. 3, there is a high correlation between the laser-pulse irradiating density and the pattern-position change rate, and the lower the laser-pulse irradiating density, the smaller the pattern-position change rate, and the higher the laser-pulse irradiating density, the larger the pattern-position change rate. That is, when a deviation amount from the ideal pattern position of the actual pattern position is known, the laser-pulse irradiating density for correcting the deviation amount can be evaluated from the positional-deviation correction information.

This example provides a case that as the positional-deviation correction information, the relationship between the laser-pulse irradiating density and the ratio of the positional change when the irradiating position is near the center of the thickness of the mask substrate is used. In addition, thereto, a relationship between an irradiating position in the thickness direction of the mask substrate and a positional change amount (ratio) can be used. The positional-deviation correction information in this case is evaluated as a positional change amount (ratio) on a side of a square when each position in the thickness direction of a predetermined area (an area of 10 square millimeters, for example) of a square of the mask substrate, for example, is irradiated with a predetermined amount of laser pulses. In addition, thereto, a relationship between the irradiating position in the thickness direction of the mask substrate and the positional change amount (rate), or a relationship between the irradiating position in a horizontal direction of the mask substrate and the positional change amount (rate) can be used to evaluate the positional-deviation correction information.

From the pattern-position change amount (rate) of the positional-deviation corrected region R, the laser-irradiation-condition calculating unit 13 uses the positional-deviation correction information to evaluate a laser-pulse irradiating condition, e.g., the laser-pulse irradiating density, for solving the positional deviation, and multiplies the laser-pulse irradiating density by an area of each positional-deviation corrected region R, thereby calculating the number of laser pulses to be irradiated in each positional-deviation corrected region R. The laser irradiating condition calculated in this case includes irradiating conditions such as the laser irradiating amount and the laser irradiating position. The irradiating conditions such as the number of laser pulses to be irradiated are stored in the positional-deviation-information storage unit 14 while being associated with each positional-deviation corrected region. In this case, an example in which the irradiating position of the laser pulse is fixed to near the center in the thickness direction of the mask substrate is used, and thus an example in which the laser-irradiation-condition calculating unit 13 uses the positional-deviation correction information to calculate the laser irradiating amount is shown. However, the laser irradiating position when the irradiating amount of the laser pulse is fixed to a predetermined value can be calculated, for example.

When the pattern-position change rate differs in the x-axis direction and the y-axis direction in the positional-deviation corrected region R, a pattern-position change rate of which the value is negative (value that represents a change in a direction into which a distance between the adjacent patterns is reduced) and also a value of which the absolute value is larger is used to calculate the laser irradiating amount. Further, when the pattern-position change rate indicates a value of an expanded direction, the positional deviation correction by the laser irradiation is not performed. The reason for this is that the correction of the positional deviation by the laser irradiation utilizes a volume expansion of the mask substrate to correct the pattern formed by constriction, and therefore it is not possible to correct the pattern formed by expansion in a constricting manner. When the pattern-position change rate is equal to or less than 0, the positional-deviation correction is not performed on the positional-deviation corrected region, and thus, by the calculation of the laser irradiating amount, a region in which the positional-deviation correction is performed is set.

The positional-deviation-information storage unit 14 stores, as the positional-deviation information, the pattern-position change amount (rate) detected by the positional-deviation detector 11 and the laser irradiating condition of each positional-deviation corrected region on the substrate calculated by the laser-irradiation-condition calculating unit 13 in a manner to associate the rate and condition with the positional-deviation corrected region on the mask substrate. The pattern-position change rate stored in the positional-deviation-information storage unit 14 needs to be a pattern-position change rate of a device-pattern forming mask pattern formed on the mask substrate. However, as shown in this example, it can be a pattern-position change rate calculated by using the reference pattern instead of the device-pattern forming mask pattern. Further, the laser irradiating condition in the positional-deviation information includes an irradiating position or position of a mask substrate with which the laser is irradiated, and an irradiating amount of the laser irradiated in that position. The irradiating position is stored in the positional-deviation-information storage unit 14, for example, a position deviated by a predetermined distance in the thickness direction of the mask substrate or the horizontal direction thereof from the center of the device pattern.

The laser irradiating unit 15 irradiates each position (positional-deviation corrected region) on the mask substrate with a laser beam of a predetermined number of pulses, based on the laser irradiating condition in each positional-deviation corrected region stored in the positional-deviation-information storage unit 14. The laser irradiating unit 15 includes a substrate holding function of holding the mask substrate, a laser light source that irradiates the substrate with a laser beam, a positioning function for irradiating a position on the mask substrate included in the positional deviation information with a laser beam. For the laser light source, an infrared laser light source that outputs an infrared laser such as a YAG (Yttrium Aluminum Garnet) laser and a carbon dioxide gas laser in a pulse shape is used. The laser light source is configured to set so that the laser light is focused on a predetermined position (for example, near the center) in the thickness direction of the substrate.

By the imprint mask manufacturing device thus configured, a portion of a predetermined depth (in this case, near the center of the thickness direction) from the surface of the mask substrate of each position (for example, a position defined by an orthogonal coordinate system where the center of the device-pattern forming mask pattern is the origin) at which the correction of the mask substrate is performed, is irradiated with a laser beam of the number of laser pulses to be irradiated according to the pattern-position change rate at that position. At the position with which the laser light is irradiated, a temperature rises instantaneously, and melted for a very short period of time, and thereafter, immediately cooled. Therefore, a heterogeneous layer increased in volume slightly more than the surrounding areas is formed. In the heterogeneous layer, the volume becomes greater than that of the surrounding mask substrate region, and thus each pattern is displaced in an expanding manner. As a result, the actual position is brought close to the ideal pattern position. In this way, even in the imprint mask that ends up with having a complicated positional distortion of a second or higher order, it becomes possible to bring the pattern position close to the ideal pattern position.

Subsequently, an imprint mask manufacturing method is described. FIG. 4 is a flowchart of one example of a procedure of the imprint mask manufacturing method executed by the imprint mask manufacturing device 10. Firstly, a resist layer is formed on the entire surface of a mask substrate such as a quartz substrate, and a resist pattern (for example, a gate layer pattern for forming a gate layer of a memory device in hp 22 nanometers) is formed in a predetermined dimension and in a predetermined shape by an exposure process and a development process in which an electron beam or an X-ray is irradiated. In this example, the patterns to be formed on the mask substrate include a reference pattern for detecting the positional deviation of the pattern on the mask substrate, and thus the patterns in a lattice as shown in FIG. 2 are to be formed. However, the reference pattern is not always necessary, and a device pattern forming pattern formed on the mask substrate can be used instead thereof. The resist pattern is used as a mask to etch the mask substrate, and thereafter, the resist pattern is removed to form the pattern on the mask substrate (Step S11). The mask substrate formed thereon with the pattern is also called an imprint mask below. In this example, a quartz substrate of about 6 millimeters in thickness is processed to form the imprint mask.

Normally, at the time of the pattern formation on the mask substrate, due to influence of a stress caused by the resist (other than the resist, a film used as a mask is sometimes formed) formed on the mask substrate or a limitation of drawing accuracy of a drawing device in an exposure process, the positional deviation (positional distortion) in which the position of the formed pattern is deviated from the ideal position occurs.

Figure 5:
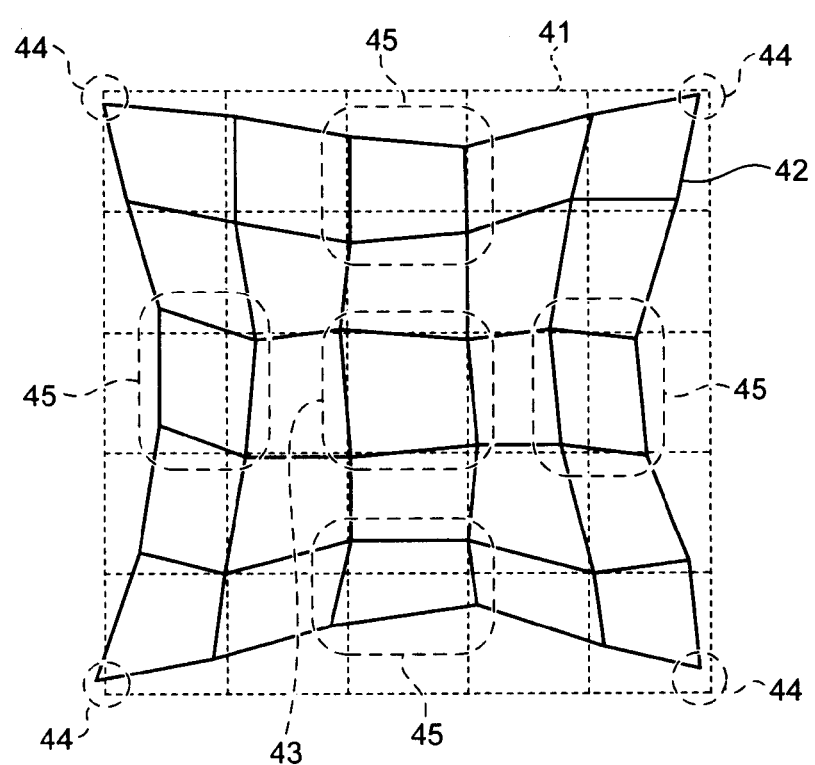
FIG. 5 is a schematic plan view of a situation where positional deviation of the imprint mask has occurred.

FIG. 5 is a schematic plan view of a situation where positional deviation of the imprint mask has occurred. In FIG. 5, a state of one portion of the surface of the imprint mask on the pattern formed side is shown. Dotted lines indicate ideal pattern positions 41, and solid lines indicate actually formed pattern positions 42. In this example, half an interval of the ideal pattern positions 41 is about 20 nanometers. However, the pattern positions 41 and 42 do not indicate the actual pattern widths, but indicate a center position of the pattern. In FIG. 5, one portion of the patterns within the imprint mask is shown, and an example of the entire positional deviation of the imprint mask is shown in FIG. 2.

As shown in FIG. 5, the actual pattern positions 42 formed on the mask substrate by etching have a complicated shape of second or higher order. At locations near a center portion 43 and at four corners 44 of the pattern position, the actual pattern positions 42 are substantially coincident with the ideal pattern positions 41. However, near center portions 45 on each side of the pattern position, the positional deviation is generated in a manner to be close to around the center portion 43.

Subsequently, by the positional-deviation detector 11, the positional deviation from the ideal position of the pattern formed on the mask substrate in a lattice is measured to calculate the pattern-position change rate indicating a deviation degree of the actual pattern position from the ideal pattern position in each position on the mask substrate (Step S12). For example, the measurement of the pattern-position change rate is evaluated for each positional-deviation corrected region R in a square shape surrounded by the four patterns, as shown in FIG. 2. The evaluated pattern-position change rate is stored in the positional-deviation-information storage unit 14 while being associated with the positional-deviation corrected region R.

Figure 6:
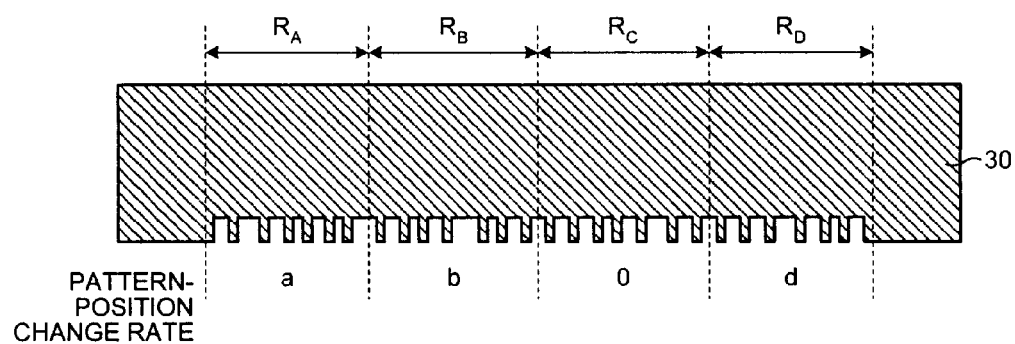
FIG. 6 is a schematic cross-sectional view of a situation where positional deviation of a pattern position has occurred after formation of the imprint mask.

FIG. 6 is a schematic cross-sectional view of a situation where positional deviation of a pattern position has occurred after formation of the imprint mask. As shown in FIG. 6, it is provided that the pattern-position change rates of four regions, i.e., $R_A$, $R_B$, $R_C$, and $R_D$, present on a certain cross section of the mask substrate 30 are A, B, 0, and D (A, B, and D are positive integers, and A>B>D is established), respectively. The pattern-position change rates A, B, 0, and D are stored in the positional-deviation-information storage unit 14 as the positional deviation information while being associated with each region $R_A$, $R_B$, $R_C$, and $R_D$. The pattern-position change rate evaluated here is calculated on condition that a direction into which a distance between the actual reference patterns is shrunk more greatly than a distance between the ideal reference patterns is positive.

Thereafter, the laser-irradiation-condition calculating unit 13 obtains laser-pulse-irradiating-density information and irradiating position information in the positional-deviation corrected region from a pattern change amount of each positional-deviation corrected region on the mask substrate based on the positional-deviation correction information stored in the positional-deviation correction-information storage unit 12. For example, the area of the positional-deviation corrected region is multiplied by the obtained laser-pulse irradiating density to calculate the number of laser pulses irradiated in the positional-deviation corrected region (Step S13).

For example, when the pattern-position change rates A, B, 0, and D of the regions $R_A$, $R_B$, $R_C$, and $R_D$ in FIG. 6 are used, the laser-pulse irradiating densities can be evaluated as a, b, 0, and d (a>b>d>0) from FIG. 3, respectively. Thereafter, the laser irradiating densities are multiplied by the area of the positional-deviation corrected region. When it is assumed that the area of each positional-deviation corrected region is the same, the larger the pattern-position change rate, the greater the number of laser pulses to be irradiated in the positional-deviation corrected region is set, and the smaller the pattern-position change rate, the fewer the number of laser pulses to be irradiated in the positional-deviation corrected region is set.

The laser irradiating unit 15 irradiates each positional-deviation corrected region on the substrate with the laser pulse based on the number of laser pulses to be irradiated calculated by the laser-irradiation-condition calculating unit 13 to form a heterogeneous layer of which the volume is increased more as compared to the surrounding mask substrate constituent material at a location near the center of the thickness direction of the imprint mask (mask substrate) (Step S14).

Figure 7:
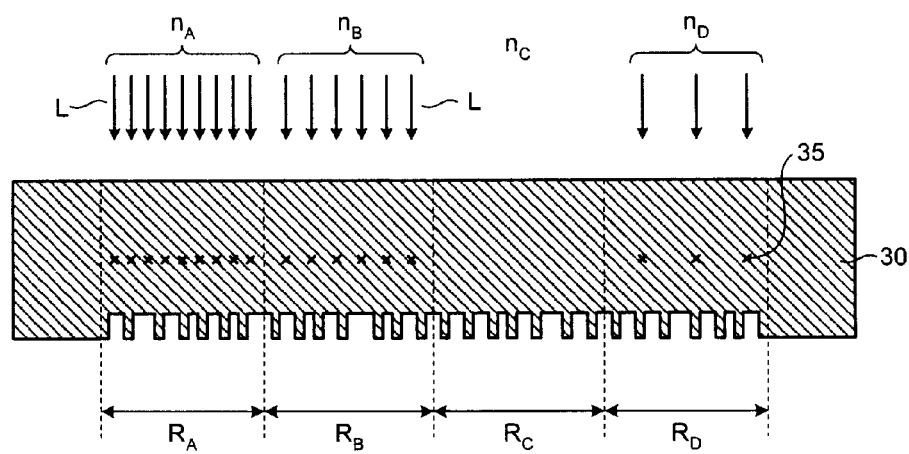
FIG. 7 is a schematic cross-sectional view of a situation where laser is being irradiated to the imprint mask.

FIG. 7 is a schematic cross-sectional view of a situation where laser is being irradiated to the imprint mask, and FIG. 8 is a schematic partial plan view of situations where the pattern position has been corrected by way of laser irradiation to the imprint mask shown in FIG. 5. FIG. 7 corresponds to the cross-sectional view of the imprint mask in FIG. 6, in which the numbers of lasers to be irradiated $n_A$, $n_B$, $n_C$, and $n_D$ irradiated in each region $R_A$, $R_B$, $R_C$, and $R_D$ are proportional to a, b, 0, and d evaluated at Step S13. When the regions $R_A$, $R_B$, and $R_D$ each having a pattern positional distortion are irradiated with a laser L, a heterogeneous layer 35 of which the volume is expanded more greatly than the surrounding areas is thus formed near the center of the thickness direction of the mask substrate 30.

Figure 8A:
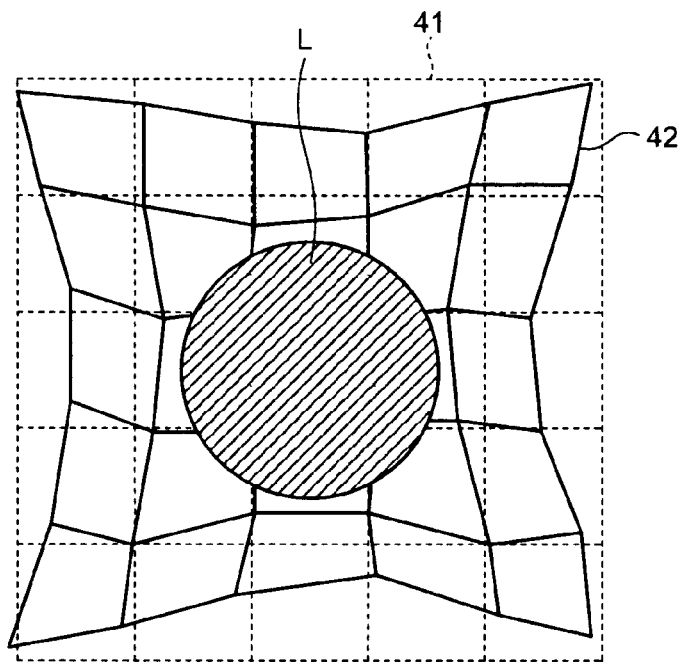
FIGS. 8A and 8B are schematic partial plan views of situations where the pattern position has been corrected by way of laser irradiation to the imprint mask shown in FIG. 5.
Figure 8B:
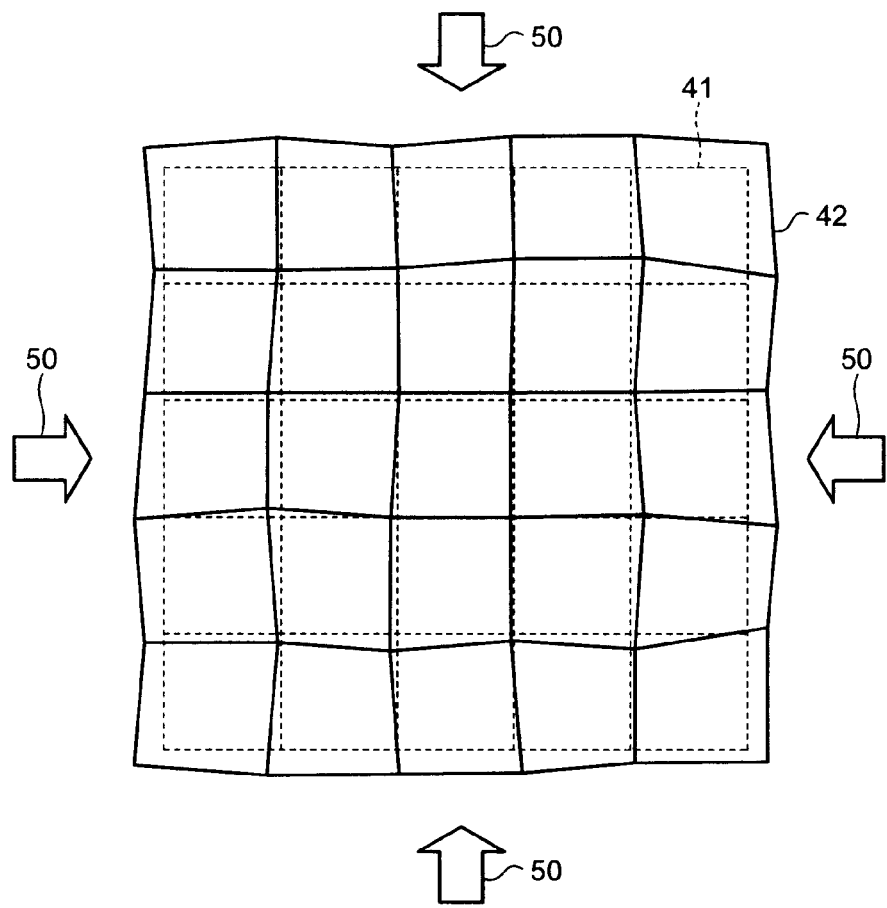

FIG. 8A is a schematic partial plan view of a state of the laser irradiation to the imprint mask shown in FIG. 5, and FIG. 8B is a schematic partial plan view of a state of a pattern position change after the laser irradiation. When the region having a pattern positional distortion as shown in FIG. 5 is irradiated with the laser L, the heterogeneous layer is formed, as described above, and influence of the volume expansion of the heterogeneous layer is transmitted concentrically about the center or irradiating position of the laser L, and patterns surrounding the irradiating position of the laser L are displaced toward a direction apart from the irradiating position of the laser L. As a result, as shown in FIG. 8B, in a pattern position deviated to a direction into which the distance between the adjacent patterns occurred at the time of forming the pattern of the imprint mask is reduced, the distance is enlarged. Thereby, the positional deviation of the pattern is solved. The number of laser pulses irradiated in each positional-deviation corrected region is set to that required for correcting the positional deviation amount. Therefore, because of the laser irradiation, a displacing amount by which the actual pattern position is close to near the ideal pattern position is achieved. Thereby, the complicated positional distortion in which the pattern position is displaced within 2-dimensional plane is solved, leaving only the positional distortion by a first-order magnification component. Besides, in the first-order magnification component, the actual pattern position 42 of the imprint mask is enlarged more greatly as compared to the ideal pattern position 41, and thus the positional distortion can be solved by simultaneously depressing an end surface of the imprinting mask by the nanoimprint device in a direction of an arrow 50 in FIG. 8B. Accordingly, the manufacturing process of the imprint mask is ended.

Immediately after the pattern formation of the imprint mask (immediately after the etching of the pattern), an amount of the positional distortion (positional deviation) of the pattern of a maximum of about 6 nanometers was present. However, the imprint mask was manufactured according to the steps described above, and when the residual positional distortion that was obtained by removing the first-order magnification component was examined, it showed a value of about 1 nanometer, which was very preferable.

Subsequently, a semiconductor device manufacturing method in which such an imprint mask is used is described. In this case, a case that the imprint mask is used to form on a processing target film a pattern in a region in which the resolution is insufficient with photolithography (for example, producing of a memory device), is described.

The entire surface on the processing target film formed on the semiconductor substrate on which the semiconductor device is manufactured is coated with a coating material, and the imprint mask and the substrate are brought into close contact by placing the pattern formed surface of the imprint mask manufactured at the manufacturing step in a manner to face the coating material. Subsequently, positioning between the imprint mask and the semiconductor substrate is performed, and thereafter, the imprint mask is pressed against the substrate via the coating material to deform the coating material, which is cured by heat or light. Thereby, the pattern of the imprint mask is transcribed to the coating material. After the coating material is sufficiently cured, the imprint mask is kept apart from the substrate and the remaining coating material is etched, thereby forming a coating material pattern on the processing target film on the substrate. The coating material pattern is used as a mask to perform etching, and thereby, the processing target film is processed. As a result, a semiconductor device having desired size and shape can be manufactured.

When the memory device is manufactured by using the imprint mask made in this manner, alignment accuracy is significantly improved as compared to the conventional imprint mask, and manufacturing yield of the memory device is also significantly improved.

While the case that the substrate is irradiated with an infrared laser to form the heterogeneous layer is described above, the substrate can be irradiated and implanted with a beam of ions such as gallium ions. In this case, an ion implantation amount is changed according to the pattern-position change rate. With the ion implantation, similar to the case of the laser irradiation, it is possible to resolve the positional distortion of the pattern of the imprint mask. In this specification, the laser beam or ion beam employed for the formation of the heterogeneous layer is called radiation.

Figure 9A:
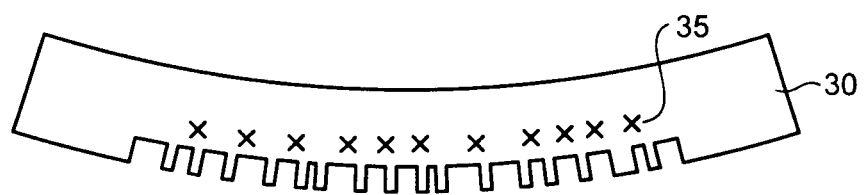
FIGS. 9A and 9B are schematic cross-sectional views of imprint masks having different shapes due to differing positions of formation positions of a heterogeneous layer.
Figure 9B:
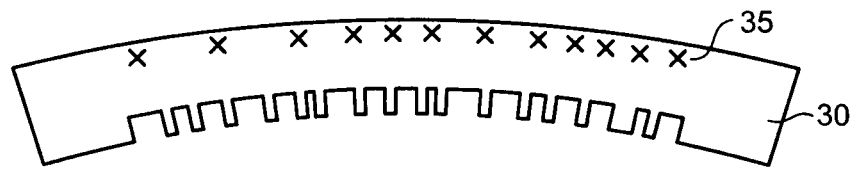

In the above explanations, the laser irradiating position is set to near the center of the thickness direction of the substrate. The reason for this is that when locations near the center of the thickness direction of the substrate are irradiated with a laser, warping of the substrate after the laser irradiation can be suppressed. However, when it is intentionally desired to impart the warping to the imprint mask after the laser irradiation, the heterogeneous layer can be formed not only near the center of the thickness direction of the substrate but also near a surface on the pattern formed side or near the surface opposite to the pattern formed side. FIG. 9A and FIG. 9B are schematic cross-sectional views of a change in shape of an imprint mask differed depending on a formed position of the heterogeneous layer, where FIG. 9A depicts a case that the heterogeneous layer is formed near the surface on the pattern formed side and FIG. 93 depicts a case that the heterogeneous layer is formed near the surface opposite to the pattern formed side. When the heterogeneous layer 35 is formed near the surface on the pattern formed side of the mask substrate 30 as in FIG. 9A, locations near the surface on the pattern formed side are expanded, and thus the surface on the pattern formed side is widened to perform the correction in a manner that the pattern is enlarged. When the heterogeneous layer 35 is formed near the surface opposite to the pattern formed side of the mask substrate 30 as in FIG. 9B, the surface opposite to the pattern formed side is widened, and thus the correction is performed in a manner that the pattern is downsized.

Therefore, according to the above embodiment, the pattern positional deviation of the imprint mask can be corrected. More specifically, after the formation of the pattern of the imprint mask, the heterogeneous layer is formed by irradiating a laser based on the position change rate of the pattern, and the positional change of the pattern is occurred by expansion of the heterogeneous layer. Thus, the positional deviation of a complicated pattern of second or higher order occurred at the time of forming the pattern of the imprint mask can be eliminated, and the actual pattern position can be corrected to be an ideal position.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask manufacturing device comprising:
a positional-deviation calculating unit that acquires positional deviation information between an actual position of a pattern formed on a mask substrate and a design position decided at a time of designing the pattern for each position on the mask substrate;
an irradiating-condition calculating unit that uses positional-deviation correction information, which indicates a relationship between an irradiating amount and an irradiating position of radiation to the mask substrate and a pattern position change after irradiation of the radiation, to calculate an irradiating condition including the irradiating amount and the irradiating position of the radiation to correct the positional deviation calculated for each position on the mask substrate; and
an irradiating unit that irradiates the mask substrate with the radiation under the irradiating condition calculated by the irradiating-condition calculating unit to form a heterogeneous layer in a predetermined position within the mask substrate, the heterogeneous layer having a volume that expands more greatly than that of surrounding mask substrate region, wherein
the irradiating-condition calculating unit calculates the irradiating amount of the radiation according to positional-deviation correction information indicating a relationship between an irradiating amount of the radiation when an irradiation position of the radiation in a thickness direction of the mask substrate is fixed and a pattern position change after irradiation of the radiation.

2. The mask manufacturing device according to claim 1, wherein the irradiating position of the radiation is near a center in the thickness direction of the mask substrate.

3. The mask manufacturing device according to claim 1, wherein the positional deviation information is information in which a positional deviation amount, obtained by subtracting a distance between designed positions of two patterns on the mask from a distance between two patterns actually formed on the mask that correspond to the designed two patterns, is associated with the actually formed pattern position, and the irradiating amount of the radiation is zero when the positional deviation is positive.

4. The mask manufacturing device according to claim 1, wherein the radiation is a laser beam or an ion beam.

5. The mask manufacturing device according to claim 1, wherein the position on the mask substrate is a predetermined area of a square of the mask substrate.

* * * * *